July 20, 1965 W. M. WEBSTER, JR 3,196,058

METHOD OF MAKING SEMICONDUCTOR DEVICES

Original Filed Aug. 24, 1959 3 Sheets-Sheet 1

INVENTOR.
WILLIAM M. WEBSTER, JR.
BY
W.S. Hill
AGENT

INVENTOR.
WILLIAM M. WEBSTER, JR.
BY
W. S. Hill
AGENT

INVENTOR
WILLIAM M. WEBSTER, JR.
BY
W. S. Hill
AGENT

3,196,058
METHOD OF MAKING SEMICONDUCTOR DEVICES

William M. Webster, Jr., Princeton, N.J., assignor to Radio Corporation of America, a corporation of Delaware Original application Aug. 24, 1959, Ser. No. 835,577, now Patent No. 3,006,791, dated Oct. 31, 1961. Divided and this application Feb. 6, 1961, Ser. No. 87,367
4 Claims. (Cl. 148—186)

This application is a division of application Serial No. 835,577, filed August 24, 1959, and issued October 31, 1961, as U.S. Patent 3,006,791.

This invention relates to improved semiconductor devices, and more particularly to improved junction devices and methods of making them.

Junction devices contain at least one rectifying barrier at the interface or junction between two regions which differ in type or magnitude of conductivity. The barrier may be of the limited area type, such as point contact or line contact devices. Alternatively, the barrier may be of the broad area type, such as surface alloyed junctions, grown junctions, and diffused junctions.

Junctions are called abrupt when the conductivity type changes very rapidly over a small distance which may be of the order of the depletion layer thickness, while junctions in which the conductivity type changes more slowly over a several-fold greater distance are known as gradual junctions.

The device known as the junction transistor comprises a body of monocrystalline semiconductive material including a zone or region of given conductivity type between two adjacent spaced regions of opposite conductivity type. Junctions are formed between the intermediate zone and each spaced region. In such units, one of the two spaced regions is known as the emitter, the other as the collector, and the intermediate given conductivity type zone as the base.

The electrical characteristics of junction devices such as transistors are dependent on many factors, among which the distribution of mobile charge carriers in the various portions of the unit is critical. The mobile charge carrier distribution is dependent on the concentration of the conductivity type-determining substance or ionized active impurity atoms in the semiconductor.

Another important factor is the abruptness of the emitter-base and base-collector junctions. For example, it is found that surface alloying produces abrupt junctions, while grown junction techniques produce gradual junctions. Diffused junctions are somewhat intermediate as to abruptness; when formed at low temperatures using a low concentration impurity source, diffused junctions are gradual; when formed by diffusion at high temperatures from a concentrated impurity source, diffused junctions are more abrupt.

Transistors with different characteristics may thus be prepared by changing the impurity density profile and by forming either abrupt or gradual emitter-base and base-collector junctions. For a more complete discussion and listing of various impurity density profiles, with the corresponding transistor types which may thus be made, see P. Kaufmann and G. Freedman, "An Analysis of Impurity Distributions and Their Relations to Electrical Behavior of Conventional Transistor Constructions," Semiconductor Products, April 1959.

For many applications, such as deflection circuits in television receivers, it is desirable to utilize transistors which can withstand a high reverse voltage without breakdown. It is also desirable that these transistors transmit relatively high currents, and act as a rapid switch. In order to withstand high reverse voltages, for example a reverse bias of over 100 volts in germanium transistors, the collector junction should be gradual, and the resistivity of that portion of the collector region immediately adjacent the base-collector junction should be high. In order to handle high currents, that portion of the collector region removed from the base-collector junction should have high conductivity, i.e., low resistivity.

Grown junction techniques give a gradual base-collector junction, but the resistivity of the collector region is too high. Surface alloyed or fused junctions give a low resistivity collector region, but the base-collector junction is abrupt and hence unable to withstand a high reverse bias. A conventional diffused collector junction will have characteristics somewhere between those of an alloy junction and a grown junction, but, at best, is an unsatisfactory compromise, since, if the diffused base-collector junction is gradual, the resistivity of the collector region is too high, while, if diffusion is performed under such conditions as to produce a low resistivity collector region, then the base-collector junction is too abrupt. Therefore, the simultaneous requirements of a high conductivity collector region and a gradual base-collector junction in the same device are difficult to attain.

Attempts have been made to solve this problem by means of the grown junction technique. For example, the collector region is grown in steps, as described, for example, in U.S. Patent 2,878,152, by growing a portion of a silicon transistor bar from a melt, then adding a certain amount of impurity to the melt, growing the next portion of the bar, placing more impurity in the melt before growing another portion, then adding still more impurity to the melt before growing the last portion of the bar. The collector region of such grown junction transistors has a low conductivity portion adjacent the base, and a high conductivity portion removed from the base, but the conductivity of each said collector portion is relatively constant, i.e., the collector region as a whole is not continuously graded. Moreover, the base region of such a device is of substantially constant medium resistivity, whereas a continuously graded base of high resistivity offers better results at high frequencies. Another problem arises, since the emitter-base junction and the base-collector junction are both formed by the same grown junction technique; they are therefore both equally abrupt or equally gradual, whereas, as discussed above, it is preferable that the two junctions differ in this respect.

Attempts have also been made to fabricate high speed transistors by a combination of in-diffusion, out-diffusion, and alloying techniques. For example, an active impurity is diffused into a given conductivity type semiconductive wafer to convert a surface region thereof to opposite conductivity type. Thereafter the wafer is heated in a vacuum, as described in U.S. Patent 2,810,870, to out-diffuse a portion of the aforesaid active impurity from the surface of the wafer. Subsequently, a portion of the wafer is removed, so that the remainder consists of a P-type layer and an N-type layer. Next, impurity dots of the same conductivity type are fused or alloyed to the opposite major faces of the wafer. Devices thus fabricated include a graded resistivity base region. However, in the collector region of such devices the resistivity decreases with distance from the junction to a value which remains constant throughout the remainder of the collector region. In other words, the collector region is not continuously graded. Moreover, the method requires a complicated process of establishing the junction location in the semiconductor wafer, then grinding and etching the wafer to establish the desired base thickness. Furthermore, the formation of large area fused junctions with the required degree of precision and uniformity is a difficult problem.

As a result of all these problems, germanium transistors which can handle currents as high as 20 amperes and withstand reverse bias of over 200 volts have not hitherto been reported.

An object of this invention is to provide improved semiconductor devices.

Another object of the invention is to provide improved methods of making improved semiconductor devices.

Still another object is to provide improved semiconductor devices capable of withstanding high reverse voltages.

But another object is to provide improved semiconductor devices capable of switching high currents at high speeds.

Yet another object is to provide improved semiconductor devices capable of withstanding high reverse voltages and switching high currents at high speeds.

These and other objects are accomplished by providing a transistor which comprises a low resistivity emitter region, an abrupt emitterbase junction, a high resistivity base region, a gradual base-collector junction, and a collector region in which the resistivity is continuously graded and decreases with increasing distance from the base region. Such devices may be prepared starting with a given conductivity type monocrystalline semi-conductive wafer having two opposed major faces, and slowly diffusing an active impurity which induces the opposite conductivity type into at least one major face of the wafer so as to convert a surface zone thereof to opposite conductivity and form a gradual junction therein. A second diffusion is now performed under such conditions as to convert a thin surface region on both major wafer faces to high conductivity of the opposite conductivity type. A portion of the high conductivity region is removed. Leads may now be attached to each major wafer face, and to the given conductivity type region between said faces. The resultant transistor has both high current transmitting capacity and the capacity of switching the high current at high speed.

The invention will be described in greater detail with reference to the accompanying drawing, in which.

Figures 3, 4:
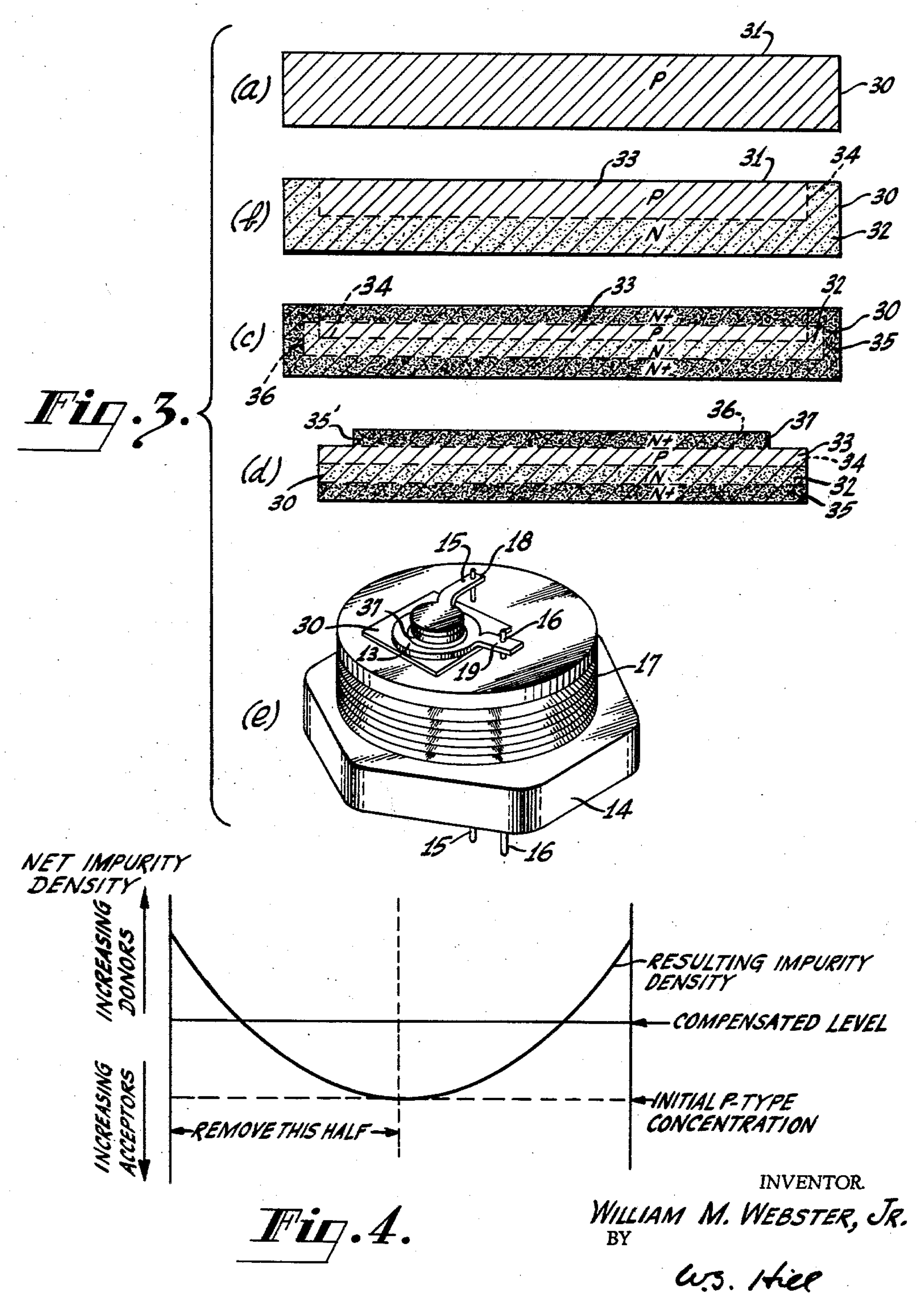

FIGURES 3*a*–3*d* are sectional views and FIGURE 3*e* is a perspective view respectively illustrating successive steps in the fabrication of a semiconductor device in accordance with the invention; and, FIGURE 4 is a diagram showing an idealized impurity density profile in a semiconductor body at one stage in the process of FIGURE 3.

Figure 1:
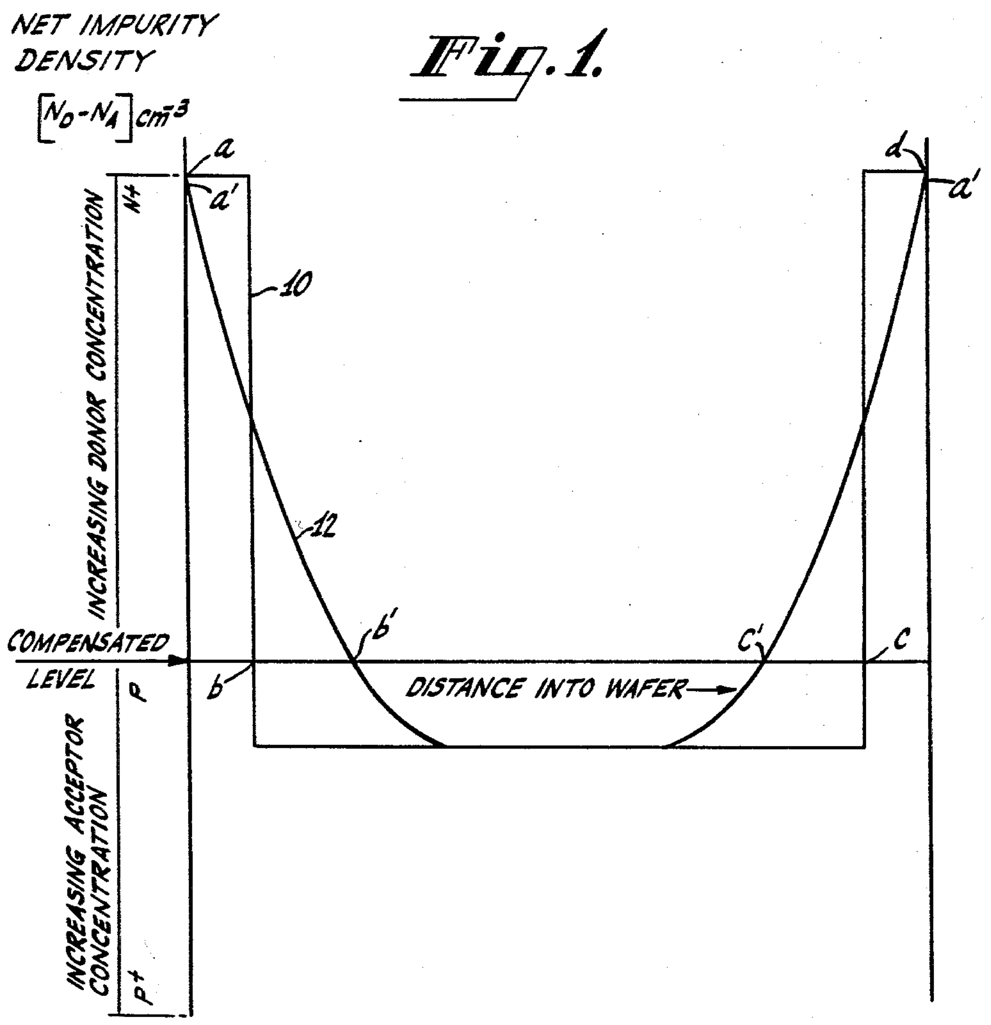
FIGURE 1 is a diagram showing the idealized impurity density profiles in a typical surface alloyed transistor and in a single-diffused transistor according to the prior art.

In FIGURE 1, curve 10 represents the impurity density profile of a surface alloyed transistor. The curve 10 is a plot of the net impurity density, which is defined as the excess of the number of donor atoms $N_D$ over the number of acceptor atoms $N_A$ per cm.$^3$, against increasing distance into the semiconductor wafer, i.e., for a transverse section across the wafer. At the compensated level, the number of donor atoms equals the number of acceptor atoms, so that the portions of the wafer at this level are neither N-type nor P-type. Above the compensated level, the excess of donors over acceptors increases, with the semiconductor going from N to N+. Below the compensated level, the excess of acceptors over donors increases, with the semiconductor going from P to P+. Starting at the axis representing a major crystal surface, the curve 10 crosses the compensated level twice, first at the transistion region between the N-type emitter region and the P-type base region, and subsequently at the transition region between the P-type base region and the N-type collector region. The curve 10 starts at *a*, at a high net impurity density of N+ concentration. The emitter-base rectifying barrier or PN junction is formed at the first transition region *b*, where the curve suddenly drops to a P value. The base-collector PN junction is formed at the second transition region *c*, where the curve suddenly increases again to a high net impurity density before terminating at *d*. The portion of curve 10 between *a* and *b* corresponds to the emitter region; the portion of the same curve from *b* to *c* corresponds to the base region; and the portion *cd* corresponds to the collector region. The collector region *cd* has a high donor concentration, and its resistivity is low, and hence it can conduct high currents. However, the base-collector junction is abrupt, so that the junction breaks down when high reverse voltages of the order of 100 volts and over are applied thereto. Surface alloyed transistors having the characteristics of the curve 10 are made, for example, by fusing or alloying lead-antimony electrode pellets to opposite major faces of a P-conductivity type germanium wafer.

Curve 12 in FIGURE 1 shows the impurity density profile of a diffused transistor, which may, for example, be fabricated by diffusing phosphorus into a P-type silicon wafer, or diffusing arsenic into a P-type germanium wafer. In curve 12, *a'b'* represents the impurity concentration in the emitter region, *b'c'* represents the impurity concentration in the base region, and *c'd'* represents the impurity concentration in the collector region. In this diffused transistor the base-collector junction is gradual, and hence the junction withstands relatively high reverse voltages before breaking down. However, the concentration of impurity atoms in the collector region, and hence the collector conductivity, is not as high as in the alloyed device represented by curve 10. Accordingly, the collector region of the diffused unit does not handle as high currents. The base-collector junction of the diffused unit can be made more gradual by adjusting temperatures and utilizing low concentration impurity sources for the diffusion step, but making the base-collector junction more gradual reduces the conductivity of the collector region. Alternatively, by using high concentration impurity sources for the diffusion step, the collector region of the diffused unit is made more conductive, but this high concentration of impurity sources makes the base-collector junction more abrupt. Thus, the impurity distribution in such a single-diffused unit at best is a compromise which does not fully provide both a high current handling capacity and a high reverse-voltage breakdown characteristic.

Figure 2:
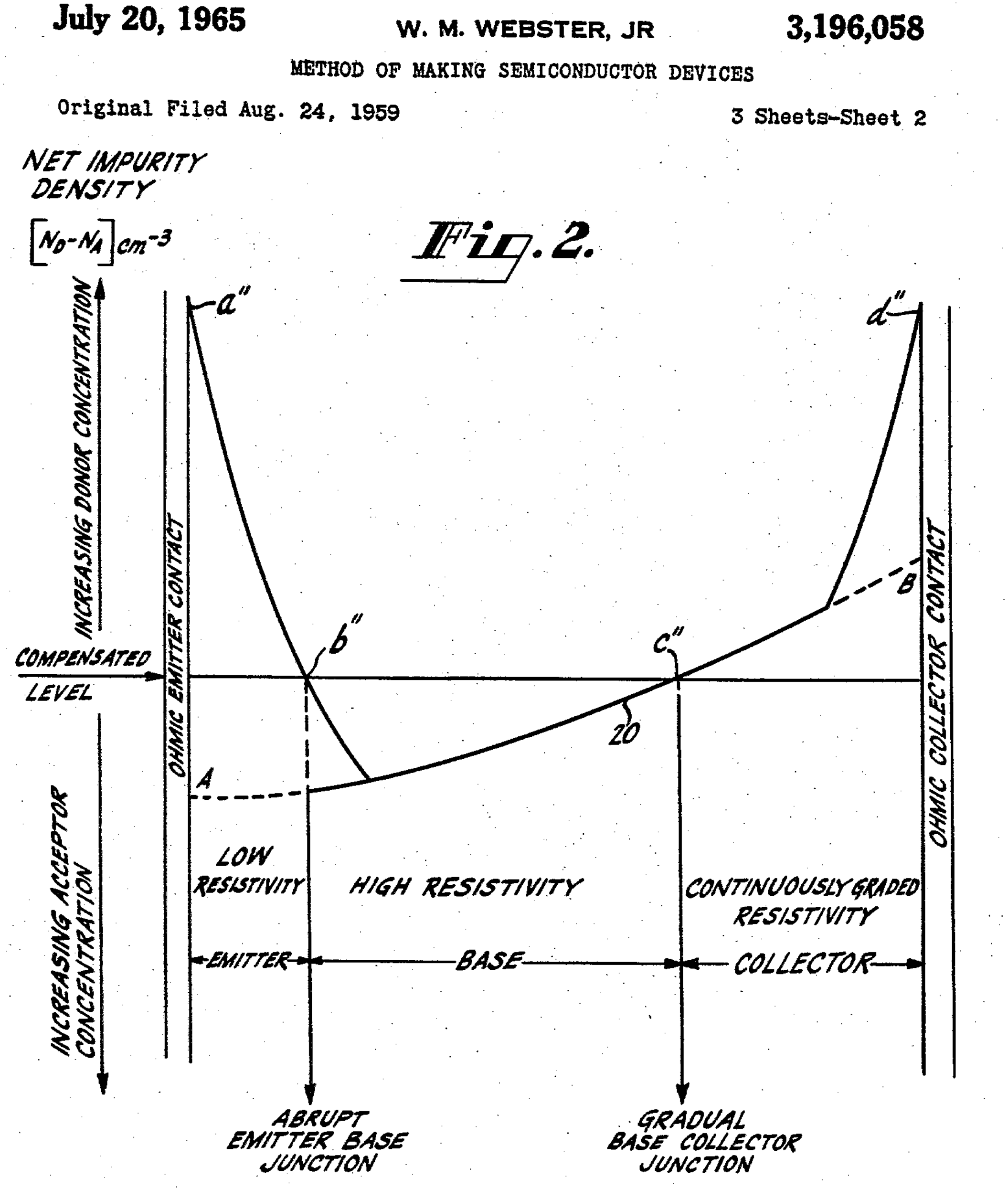
FIGURE 2 is a diagram showing the idealized impurity density profile in a transistor according to the invention.

Referring to FIGURE 2, curve 20 represents the impurity density profile in a semi-conductor device according to the invention. The profile is that of a transverse section from a metallic ohmic emitter contact across the emitter, base and collector regions to an ohmic metallic collector contact. The curve illustrated is that for an NPN transistor, as are each of the curves 10 and 12 in FIGURE 1, but it will be understood that this is by way of illustration only, since PNP units may be fabricated with similar characteristics for reverse polarity voltages by reversing the conductivity types of the various device portions. The impurity density profiles of the corresponding PNP devices would simply be reversed or symmetrically reflected around the compensated level.

It will be appreciated that the transistor of curve 20 comprises a high conductivity emitter region represented by the portion *a''b''* of curve 20, and an abrupt emitter-base junction represented by the portion of the curve around *b''*, which combination provides good injection efficiency; a low conductivity base region represented by the portion *b''c''* of curve 20 graded to lower conductivity adjacent the collector, thus providing improved performance at high frequencies; a gradual base-collector junction represented by the portion of the curve around *c''* and a continuously graded collector region represented by the portion *c''d''* of curve 20 having high conductivity in the portion of the collector remote from the base-collector junction, which combination provides the ability to withstand high reverse voltages and to transmit high currents. The device of curve 20 thus combines the advantages of a high conductivity collector region, as in alloyed units, with the advantages of a gradual base-collector junction, as in diffused units.

The impurity density distribution represented by curve 20 may be achieved, for example, by starting with a given conductivity type monocrystalline semiconductive wafer having two opposed major faces, the wafer being about twice as thick as that ultimately desired. The wafer initially has a uniform low resistivity, and may for example be of P-conductivity type, as illustrated in FIGURE 4. Thereafter, a type-determining substance which induces opposite conductivity type in the semiconductor selected, and is also known as an active impurity, is diffused into the wafer to form a surface zone of opposite conductivity type. In this example, since the wafer is initially P-type, the active impurity is a donor. This diffusion step is performed under such conditions of temperature and low impurity source concentration as to form a gradual junction all around the wafer interior. The resulting impurity density distribution is shown by curve 40 in FIGURE 4. Next, the wafer is reduced from one major face to about half its initial thickness, thereby removing the aforesaid surface zone adjacent said one major face. The impurity density curve in the remaining half of the wafer is the portion AB, and this curve is exactly the same as curve AB of FIGURE 2, the only difference being an enlargement of scale in FIGURE 2 for greater clarity.

A second diffusion step is performed on the remaining half of the wafer. Again a donor is diffused into the wafer, but in the second diffusion step the parameters of diffusion temperatures, diffusion time, and impurity source concentration are adjusted to produce a thin surface region which is strongly N-type and hence exhibits high conductivity. The low impurity concentration near each major wafer face, which is shown by the dashed portions of the curve in FIGURE 2 as lightly P-type at A and lightly N-type at B, is thus completely overwhelmed by the second diffusion step. The combination of the two separate steps results in the impurity density profile depicted by the solid curve 20 in FIGURE 2. The unit is completed by removing a portion of said high conductivity region, and attaching leads to each major face and to the given conductivity region between said faces. The device thus formed comprises a heavily doped emitter region, an abrupt emitter-base junction, a lightly doped graded base region, a gradual base-collector junction, and a continuously graded heavily doped collector region in which the portion remote from the base-collector junction is more heavily doped than the portion adjacent said junction.

Alternatively, one major face of the semiconductor wafer may be masked, and a type-determining impurity diffused into the other major face under such conditions as to form a single gradual junction in the wafer. The impurity density profile will then resemble portion AB of curve 40 in FIGURE 4. Thereafter the mask is removed, and a second diffusion step is performed with the same impurity, or with one which induces the same conductivity type, so that the resulting impurity density distribution resembles curve *a″b″c″d″* in FIGURE 2.

Since the particular advantages of the instant invention are obtained by two successive diffusion steps, in which an active impurity of the same conductivity type is diffused into the semiconductor body during each diffusion step, devices made according to the instant invention are distinguished from so-called double-diffused devices. The term "double-diffused" has become associated in the art with the simultaneous or successive diffusion of two active impurities of opposite conductivity type, e.g., the simultaneous diffusion of an acceptor and a donor into a semiconductive body.

A preferred example will now be given illustrating the preparation of a broad-area germanium junction triode of the NPN type in accordance with the present invention. However, it is to be understood that by utilizing appropriate active impurities the method is equally applicable in making PNP devices, and that other crystalline semiconductors such as silicon, silicon-germanium alloys, and compounds such as the phosphides, arsenides, and antimonides of aluminum, gallium, and indium may be utilized instead of germanium.

*Example*

FIGURE 3*a* is a sectional view of a monocrystalline semiconductor wafer 30 having two opposed major faces. In this example, wafer 30 consists of P-type germanium having a resistivity of about 1 to 20 ohm centimeters. The exact wafer dimensions are not critical. In this example, germanium wafer 30 is about 300 mils square and 6 mils thick. One major wafer face is masked by means of a coating 31 which is practically impervious to the subsequent diffusion of active impurities. A suitable coating for this purpose may be formed by heating the wafer in the vapors of an organic siloxane compound at a temperature below the melting point of the semiconductor but above that at which the siloxane decomposes, so that an inert adherent coating of silicon oxide is formed on the wafer surface. In this example, the wafer 30 is heated from 10–15 minutes at about 700° C. in a quartz furnace containing triethoxysilane, using argon as the carrier gas to sweep the siloxane fumes through the furnace. The coating 31 will thus cover the entire wafer, but may be readily removed from one major wafer face by washing that one face with 5% hydrofluoric acid. Alternatively, one wafer face may be waxed down on a glass slide prior to the siloxane treatment, so that the adherent coating 31 is formed only on the exposed major wafer face. The wax is subsequently removed by an organic solvent, such as trichlorethylene.

Referring now to FIGURE 3*b*, a conductivity type-determining substance, which in this example is a donor, is diffused into the masked wafer 30 by any convenient method. The impurity diffuses into the unmasked major face at least two orders of magnitude more rapidly than it diffuses throughout the coating 31, hence an impurity-diffused N-type zone 32 is formed adjacent the uncoated major face of the wafer. A rectifying barrier or PN junction 34 is thereby fabricated at the interface between the impurity-diffused N-type surface zone 32 and the remaining P-type portion 33 of the wafer.

A suitable method of diffusing an active impurity such as a donor or an acceptor into germanium wafers is described in U.S. Pat. No. 2,870,050, issued January 20, 1959 to C. W. Mueller et al. and assigned to the assignee of this application. In this example, the germanium wafer 30 is immersed in a powder composed of germanium which has been doped with $4\times10^{16}$ antimony atoms per $cm.^3$. The wafer is heated for one hour at about 800° C. while immersed in the powder. The antimony diffuses into the unmasked face of the germanium wafer about 0.3 mil deep during this step, but practically no antimony diffuses into the masked wafer face under these conditions. The wafer is then cooled, removed from the powder, and reheated for 20 hours at 850° C. in a nitrogen atmosphere. During this step the antimony is driven into the wafer to a depth of about 3 mils, and a shallow impurity gradient is produced. The concentration of antimony in the source powder, the furnace temperature, and the duration of the heating steps are adjusted to produce a concentration of about $10^{16}$ atoms of antimony per $cm.^3$ on the wafer surface. Under these conditions of a small impurity gradient, the antimony impurity density profile of wafer 30 is similar to that shown in portion AB of the curve in FIGURE 4, and the rectifying barrier or PN junction 34 is formed about 3 mils below the wafer surface. Junction 34 thus formed is so gradual as to exhibit a high breakdown voltage.

Referring now to FIGURE 3*c*, the masking coating 31 is removed by washing the wafer 30 in 5% hydrofluoric acid, and a second diffusion step is performed on the wafer. This time the parameters of source concentration, temperature, and time in furnace are adjusted to give a large impurity density gradient. In this example, the second diffusion step is accomplished by heating wafer 30 in a nitrogen-swept furnace for about one hour at 800° C. while the wafer is immersed in a powder composed of 95% germanium and 5% arsenic by weight. A thin surface region 35 of wafer 30 is thereby heavily doped with arsenic and thus converted to $N^+$ conductivity type. The concentration of arsenic in the wafer surface after this step is about $10^{20}$ atoms per $cm.^3$.

Next, the ends of wafer 30 are removed, leaving the wafer with successive layers, from the bottom as viewed in FIGURE 3*d*, of $N^+$, N, P, and $N^+$ conductivity. The removal of the ends may be accomplished by grinding wheels, cutting tools, lapping techniques, or masking and etching methods. In this example, portions of the wafer are covered with an acid resist such as wax, and the remainder is removed by an etchant consisting of a mixture of hydrofluoric and nitric acids. The removal of the wafer ends divides the $N^+$ region 35 into two separate zones. One zone 35 is adjacent the N-type zone 32, while the other zone or layer, which is marked 35' in FIGURE 3*d*, is adjacent the P-type zone 33.

To facilitate the fabrication of a base contact, it is convenient during the same etching step to remove a portion of that $N^+$ zone 35' which is adjacent to P layer 33. In this example, the remaining portion of the etched $N^+$ layer 35' is a disc-shaped mesa or plateau 37 with a diameter of about 225 mils. This mesa 37 becomes the emitter region of the device. It will be seen that in the collector region of the device, which is the region below base-collector junction 34, the portion 35 remote from the base-collector junction 34 is more heavily doped with active impurity (arsenic in this example) than the antimony-diffused N-type portion 32 adjacent to the base-collector junction 34.

Referring now to the perspective view in FIGURE 3*e*, the semiconductor wafer 30 is soldered down to a copper header 14 which serves as a heat sink, and also becomes the collector connection. The header or mounting base 14 contains two stem leads 15 and 16 which are insulated from the header. For convenience, the base also contains a threaded portion 17 to facilitate subsequent insertion of the device into a tapped hole in a chassis. The wafer 30 is soldered to the header in this example by means of a lead-antimony solder, with the disc-shaped emitter mesa 37 uppermost. Emitter connector 18 is a metal tab on one stem lead 15 which is soldered to the $N^+$ upper surface of the mesa 37. In this example, the emitter connection 18 is composed of nickel or nickel alloys coated with lead-tin solder. Base connector 19 is a metal tab mounted on the other stem lead 16 and terminating in a ring 13 which is soldered to the upper surface of the P-type base region of the wafer around mesa 37. In this example, the base connection 19 is composed of nickel coated with indium. The device may then be encapsulated and cased by known methods.

An advantage of devices according to the invention is the high emitter injection efficiency obtained by the juxtaposition of a high conductivity emitter region with a low conductivity base region. Another advantage is that the concentration of active impurity atoms in the base region is graded from higher adjacent the emitter to lower adjacent the collector. Such grading produces a built-in field which accelerates the passage of minority charge carriers from the emitter across the base region to the collector, and thereby increases the high frequency response of the unit. Furthermore, the high conductivity of the portion of the collector region remote from the base enables the device to handle currents as large as 20 amperes, while the continuous grading of the collector region and the gradual base-collector junction enables the device to withstand high reverse voltages without breakdown. Conventional NPN germanium transistors break down when the applied reverse collector bias reaches 60 to 100 volts. In contrast, transistors according to the invention withstand a reverse voltage of 400 volts and higher without breakdown. Some germanium NPN units made according to the invention as described in connection with FIGURE 3 have exhibited both the ability to handle 20 ampere currents and a reverse breakdown voltage as high as 700 volts.

What is claimed is:

1. A method of fabricating a high breakdown voltage transistor comprising the following steps:

preparing a given conductivity type monocrystalline semiconductive wafer with two opposed major faces and two wafer ends;

diffusing an active impurity into said wafer at a first and slow rate from a first and low concentration impurity source maintained at a first and low temperature so as to convert a surface zone thereof all around said wafer to opposite conductivity type and form a gradual junction therein;

reducing the wafer thickness from one said major wafer face to about half the original wafer thickness;

diffusing an active impurity into said wafer at a second rate greater than said first diffusion rate from a second impurity source at a second concentration higher than said first impurity source concentration and maintained at a second temperature higher than said first source temperature so as to convert a thin surface region on both said major wafer faces to conductivity of said opposite conductivity type but higher conductivity than said surface zone;

removing the wafer ends to divide the said higher conductivity surface region into two separate zones adjacent said two major wafer faces;

removing a peripheral portion of the high conductivity surface region adjacent the given conductivity type region of said wafer to expose a portion of said given conductivity type region; and, attaching leads to the remaining portion of each major face and to said exposed portion of said given conductivity type region.

2. A method of fabricating a high breakdown voltage transistor comprising the following steps:

preparing a given conductivity type monocrystalline semiconductive wafer with two opposed major faces and two wafer ends;

masking one major face of said wafer;

diffusing an active impurity into the unmasked major wafer face at a first and slow rate from a first and low concentration impurity source maintained at a first and low temperature, so as to convert a surface zone thereof to opposite conductivity type and form a gradual junction therein;

removing the mask from said one major wafer face;

diffusing an active impurity into said wafer at a second rate greater than said first diffusion rate from a second impurity source at a second concentration higher than said first impurity source concentration and maintained at a second temperature higher than said first impurity source temperature so as to convert a thin surface region on both major wafer faces to conductivity of said opposite type, but higher conductivity than said surface zone;

removing the wafer ends to divide the said higher conductivity surface region into two separate zones adjacent said two major wafer faces;

removing a peripheral portion of said high conductivity surface region adjacent the given conductivity type region of said wafer to expose a portion of said given conductivity type region; and, attaching leads to the remaining portion of each major face and to said exposed portion of said given conductivity type region of said wafer.

3. A method of fabricating a high breakdown voltage transistor comprising the following steps:

preparing a given conductivity type monocrystalline semiconductive wafer with two opposed major faces and two wafer ends;

masking one major face of said wafer;

diffusing an active impurity into the unmasked major wafer face at a first and slow rate from a first and low concentration impurity source maintained at a first and low temperature so as to convert a surface zone thereof to opposite conductivity type and form a gradual junction therein, said first impurity source concentration and said first impurity source temperature being sufficient to produce an impurity atom concentration of about $10^{16}$ impurity atoms per $cm.^3$ on the surface of said unmasked wafer face;

removing the mask from said one major wafer face;

diffusing an active impurity into said wafer at a second rate greater than said first diffusion rate from a second impurity source at a second concentration higher than said first impurity source concentration and maintained at a second temperature higher than said first impurity source temperature so as to convert a thin surface region on both major faces to conductivity of said opposite type but higher conductivity than said surface zone, the concentration and temperature of said second impurity source being sufficient to produce an impurity atom concentration of about $10^{20}$ impurity atoms per $cm.^3$ on the entire surface of said wafer;

removing the wafer ends to divide the said higher conductivity surface region into two separate zones adjacent said two major wafer faces;

removing a peripheral portion of said high conductivity surface region adjacent the given conductivity type region of said wafer to expose a portion of said given conductivity type region; and, attaching one electrical lead to the remaining portion of one major face, attaching another electrical lead to the remaining portion of the other major face, and attaching another electrical lead to said exposed portion of said given conductivity type region.

4. A method of fabricating a high breakdown voltage transistor comprising the following steps:

preparing a P-type monocrystalline germanium wafer with two opposed major faces and two wafer ends;

masking said one major face;

diffusing antimony into the unmasked wafer face at a first and slow rate from an antimony source at a first and low concentration maintained at a first and low temperature, so as to convert a surface zone of said wafer to N-type conductivity and form a gradual junction therein, said antimony source concentration and temperature being sufficient to produce a concentration of about $10^{16}$ antimony atoms per $cm.^3$ on said unmasked wafer face;

removing the mask from said one major wafer face;

diffusing arsenic into said wafer at a second rate greater than said first diffusion rate from an arsenic source at a second concentration greater than said first source concentration and maintained at a second temperature higher than said first source temperature so as to convert a thin surface region on both said major wafer faces to N-type conductivity but higher conductivity than said surface zone, said concentration and temperature of said arsenic source being sufficient to produce a concentration of about $10^{20}$ arsenic atoms per $cm.^3$ on the wafer surface;

removing the wafer ends to divide the said higher conductivity surface region into two separate zones adjacent said two major wafer faces;

removing a peripheral portion of the arsenic-diffused high conductivity N-type surface region adjacent the P-type region of said wafer to expose a portion of said P-type region; and, attaching one electrical lead to the remaining portion of one major wafer face, attaching another electrical lead to the remaining portion of the other major wafer face, and attaching another electrical lead to the exposed portion of said given conductivity type region.

References Cited by the Examiner

UNITED STATES PATENTS

| | | | |
|---|---|---|---|
| 2,569,347 | 9/51 | Shockley | 148—1.5 X |
| 2,804,405 | 8/57 | Derick et al. | 148—1.5 |
| 2,930,722 | 3/60 | Ligenza | 148—1.5 |
| 2,985,805 | 5/61 | Nelson | 148—1.5 X |

BENJAMIN HENKIN, *Primary Examiner.*

DAVID L. RECK, MARCUS U. LYONS, *Examiners.*